United States Patent
Sterzbach

(10) Patent No.: US 10,877,066 B2
(45) Date of Patent: Dec. 29, 2020

(54) METHOD AND APPARATUS USED FOR TESTING A DEVICE UNDER TEST

(71) Applicant: Rohde & Schwarz GmbH & Co. KG, Munich (DE)

(72) Inventor: Bernhard Sterzbach, Munich (DE)

(73) Assignee: ROHDE & SCHWARZ GMBH & CO. KG, Munich (DE)

(*) Notice: Subject to any disclaimer, the term of this patent is extended or adjusted under 35 U.S.C. 154(b) by 359 days.

(21) Appl. No.: 15/908,857

(22) Filed: Mar. 1, 2018

(65) Prior Publication Data

US 2019/0271719 A1 Sep. 5, 2019

(51) Int. Cl.
| | | |
|---|---|---|
| G01R 31/00 | (2006.01) | |
| G01R 1/04 | (2006.01) | |
| G01R 31/319 | (2006.01) | |
| G01R 1/18 | (2006.01) | |
| G01R 1/067 | (2006.01) | |
| G01R 31/28 | (2006.01) | |

(52) U.S. Cl.
CPC ............ *G01R 1/045* (2013.01); *G01R 1/0466* (2013.01); *G01R 1/06711* (2013.01); *G01R 1/06772* (2013.01); *G01R 1/18* (2013.01); *G01R 31/2886* (2013.01); *G01R 31/31905* (2013.01); *H01L 2224/05599* (2013.01); *H01L 2224/48465* (2013.01); *H01L 2924/00* (2013.01); *H01L 2924/00014* (2013.01)

(58) Field of Classification Search
CPC ....... H01L 2924/00014; H01L 2924/00; H01L 2224/48465; H01L 2224/05599; G01R 1/18; G01R 1/06772; G01R 31/2886; G01R 1/06711
USPC ......... 324/71, 378, 403, 415, 425, 500, 537, 324/750.26
See application file for complete search history.

(56) References Cited

U.S. PATENT DOCUMENTS

| | | | |
|---|---|---|---|
| 10,466,291 B2 | 11/2019 | Mylsamy | |
| 2006/0186912 A1* | 8/2006 | Norris | G01R 31/2868 324/750.05 |
| 2014/0317453 A1* | 10/2014 | Holt | G06F 11/221 714/44 |
| 2015/0355268 A1* | 12/2015 | Rogel-Favila | G01R 31/2893 324/750.08 |
| 2016/0173678 A1* | 6/2016 | DeCamp | G06F 1/266 455/557 |
| 2016/0202292 A1* | 7/2016 | West | G01R 1/067 324/750.25 |
| 2016/0231777 A1* | 8/2016 | DeCamp | H04B 1/3827 |
| 2017/0067936 A1* | 3/2017 | Tay | G01R 1/0408 |

* cited by examiner

*Primary Examiner* — Raul J Rios Russo
(74) *Attorney, Agent, or Firm* — Shumaker & Sieffert, P.A.

(57) ABSTRACT

A test adapter apparatus comprising at least one device under test, DUT, holder adapted to hold a device under test, DUT and adapted to be plugged in into a docking station of said test adapter apparatus, wherein the docking station has RF and data interfaces used for connecting at least one external test device through said docking station with the device under test, DUT, held by said device under test holder.

15 Claims, 7 Drawing Sheets

METHOD AND APPARATUS USED FOR TESTING A DEVICE UNDER TEST

TECHNICAL FIELD

The invention relates to a test adapter apparatus and to a method for testing a device under test DUT using at least one device under test holder plugged into a docking station.

TECHNICAL BACKGROUND

During development and production stages, different kinds of devices under test DUT can be operated using different test and measurement setups. The devices under test DUT such as mobile radio devices can be moved and used in different test setups. In conventional test setups, devices under test DUT such as mobile radio devices are installed manually by the test operator. The devices under test are fitted with connectors such as RF connectors to provide an RF connection with a testing device. The devices under test DUT can comprise non-standard connections, e.g. RF cabling instead of internal antenna. These connections are difficult to apply in a reproducible way. In a conventional test setup, the devices under test DUT are fitted with additional connectors such as RF connectors which may be glued to the housing of the device under test DUT. The provision of additional connectors can be very cumbersome and error-prone. The handling of the device under test DUT by the test operator may also damage the device under test DUT, for instance if the device under test DUT falls to the floor during the operation. The fitting of connectors required for testing the devices under test DUT to the housing of the device can also take some time so that the total testing time does increase.

During the development stage where prototypes of devices under test DUT such as mobile radio devices are developed and tested, confidentiality requirements have to be fulfilled. This makes it necessary to restrict unlimited access to the device under test itself. Confidential prototypes of devices under test DUT can be inserted into lockable boxes to provide confidentiality. These lockable boxes must be configured manually to suit the respective device under test DUT.

Accordingly, there is a need for a test adapter apparatus providing a more robust and reliable way to test such devices under test DUT.

SUMMARY OF THE INVENTION

The invention provides according to a first aspect a test adapter apparatus comprising at least one device under test DUT holder adapted to hold a device under test DUT and adapted to be plugged into a docking station of said test adapter apparatus, wherein the docking station has RF and data interfaces used for connecting at least one external test device through said docking station with the device under test DUT held by said device under test holder.

The device under test holder of the test adapter apparatus protects the device under test against mechanical damages during the testing procedure.

Further, the device under test holder of the test adapter apparatus allows to grab and move the device under test by robot arms of an automation system during the testing procedure without affecting or damaging the device under test.

The device under test holder can be plugged into a docking station having RF and data interfaces allowing fast connection with an external test device. Further, the docking mechanism of the docking station provides a reliable electrical connection via the docking station with the external test device, thus reducing considerably the probability of connection errors in the test setup.

The test adapter apparatus further allows for automatic testing of a wide variety of different kinds of devices under test during development and/or production of devices under test.

The device under test holder of the test adapter apparatus encloses the device under test so that confidentiality requirements concerning the device under test during development and/or production are fulfilled.

The device under test holder of the test adapter apparatus receiving the device under test can protect the device under test against mechanical damages but also against interferences or electromagnetic fields during the testing procedure.

In a possible embodiment of the test adapter apparatus according to the first aspect of the present invention, the docking station comprises at least one first docking station interface connector for connection of the at least one external test device with the docking station.

In a possible embodiment of the test adapter apparatus according to the first aspect of the present invention, the docking station further comprises at least one second docking station interface connector for connection of said device under test holder with the docking station.

In a further possible embodiment of the test adapter apparatus according to the first aspect of the present invention, the first docking station interface connector of the docking station can comprise a first RF interface provided for RF signals, a first data interface provided for data signals, and
a first power supply interface provided for power supply.

In a further possible embodiment of the test adapter apparatus according to the first aspect of the present invention, the second docking station interface connector of the docking station can comprise a second RF interface provided for RF signals, a second data interface provided for data signals, and
a second power supply interface provided for power supply.

In a further possible embodiment of the test adapter apparatus according to the first aspect of the present invention, the first RF interface of the first docking station interface connector is directly connected via RF signal lines within said docking station to the second RF interface of the second docking station interface connector.

In a further possible embodiment of the test adapter apparatus according to the first aspect of the present invention, the first data interface of the first docking station interface connector is connected to a data processing unit provided within the docking station.

In a further possible embodiment of the test adapter apparatus according to the first aspect of the present invention, the second data interface of the second docking station interface connector is connected to the data processing unit of said docking station.

In a further possible embodiment of the test adapter apparatus according to the first aspect of the present invention, the second docking station interface connector of the docking station is provided at a device under test holder slot of the docking station into which a device under test holder is pluggable to establish a connection between the second docking station interface connector and a device under test holder interface connector of said device under test holder.

In a still further possible embodiment of the test adapter apparatus according to the first aspect of the present invention, the device under test holder interface connector comprises an RF interface provided for RF signals,
a data interface provided for data signals and
a power supply interface provided for power supply.

In a still further possible embodiment of the test adapter apparatus according to the first aspect of the present invention, the first power supply interface of the first docking station interface connector is connected to a power supply source.

In a still further possible embodiment of the test adapter apparatus according to the first aspect of the present invention, the second power supply interface of the second docking station interface connector is connectable to the power supply interface of the device under test holder interface connector of the device under test holder.

In a still further possible embodiment of the test adapter apparatus according to the first aspect of the present invention, the RF interface of the device under test holder interface connector of the device under test holder is connected to RF interface ports of the device under test held by the device under test holder.

In a still further possible embodiment of the test adapter apparatus according to the first aspect of the present invention, the power supply interface of the device under test holder interface connector of the device under test holder is connected to power supply pins of the device under test held by the device under test holder.

In a still further possible embodiment of the test adapter apparatus according to the first aspect of the present invention, the data interface of the device under test holder interface connector of the device under test holder is connected to a first memory of the device under test holder storing device under test specific data of the device under test held by the device under test holder comprising a DUT identifier, a DUT type, DUT configuration data, DUT calibration data, DUT operating power requirements and used interface lines.

In a still further possible embodiment of the test adapter apparatus according to the first aspect of the present invention, the data interface of the device under test holder interface connector of the device under test holder is connected to a second memory of the device under test holder storing DPU configuration data used to configure a data processing unit, DPU, of the docking station to control the device under test, DUT, held by the device under test holder.

In a further possible embodiment of the test adapter apparatus according to the first aspect of the present invention, the DPU configuration data stored in the second memory of the device under test holder comprises a boot image and/or configuration files including an operating system, device drivers, control software components and/or automation software components used by the data processing unit, DPU, of the docking station to control the device under test, DUT, held by the device under test holder.

In a further possible embodiment of the test adapter apparatus according to the first aspect of the present invention, the docking station comprises a plug-in detector adapted to detect an insertion of a device under test holder plugged into a device under test holder slot of said docking station.

In a still further possible embodiment of the test adapter apparatus according to the first aspect of the present invention, the plug-in detector of the docking station is adapted to notify the data processing unit, DPU, of the docking station about a plugged-in device under test holder to access a first memory integrated in the plugged-in device under test holder for loading device under test specific data of the device under test held by the plugged-in device under test holder and to access a second memory integrated in the device under test holder for loading DPU configuration data used by the data processing unit of the docking station to control the device under test held by the plugged in device under test holder.

In a further possible embodiment of the test adapter apparatus according to the first aspect of the present invention, the docking station comprises at least one SIM card holder and/or SIM card simulator.

In a still further possible embodiment of the test adapter apparatus according to the first aspect of the present invention, the docking station comprises a controllable switch unit adapted to selectively connecting a device under test held by the device under test holder plugged into a device under test holder slot of the docking station to a SIM card holder and/or to a SIM card simulator of said docking station.

The invention further provides according to a second aspect a test adapter docking station comprising at least one first docking station interface connector having RF and data interfaces for connection to a test device and at least one second docking station interface connector having RF and data interfaces for connection of a device under test holder which holds a device under test to be tested by the test device through said test adapter docking station.

The invention further provides according to a further aspect a device under test holder comprising a reception chamber adapted to receive and hold a device under test, DUT, in particular a mobile radio device,
a data memory storing device under test, DUT, specific data of the device under test, DUT, and/or storing DPU configuration data for controlling the device under test, DUT, by a data processing unit, DPU, of a docking station, the device under test further comprising a device under test holder interface connector adapted to be plugged into a device under test holder slot of the docking station.

In a possible embodiment of the device under test holder according to the third aspect of the present invention, the device under test holder further comprises a cover used for covering the device under test, DUT, held within the reception chamber of the device under test holder.

In a possible embodiment of the device under test holder according to the third aspect of the present invention, the device under test holder comprises an optical transparent cover.

In a further possible alternative embodiment of the device under test holder according to the third aspect of the present invention, the device under test holder comprises an optical opaque cover.

In a further possible embodiment of the device under test holder according to the third aspect of the present invention, the device under test holder comprises an RF permeable cover.

In a still further possible alternative embodiment of the device under test holder according to the third aspect of the present invention, the device under test holder comprises an RF shielding cover.

In a still further possible embodiment of the device under test holder according to the third aspect of the present invention, the device under test holder comprises locking means adapted to lock the cover of the device under test holder.

The invention further provides according to a fourth aspect a method for testing a device under test, DUT, comprising the steps of:
inserting the device under test, DUT, into a device under test holder,
plugging the device under test holder with the inserted device under test, DUT, into a device under test holder slot of a docking station and connecting the docking station with an external test device which performs testing of the device under test, DUT, through the docking station by processing RF signals and/or data of the device under test, DUT, inserted in the plugged-in device under test holder.

BRIEF DESCRIPTION OF FIGURES

In the following, possible embodiments of the different aspects of the present invention are described in more detail with reference to the enclosed figures.

DETAILED DESCRIPTION OF EMBODIMENTS

Figure 1:
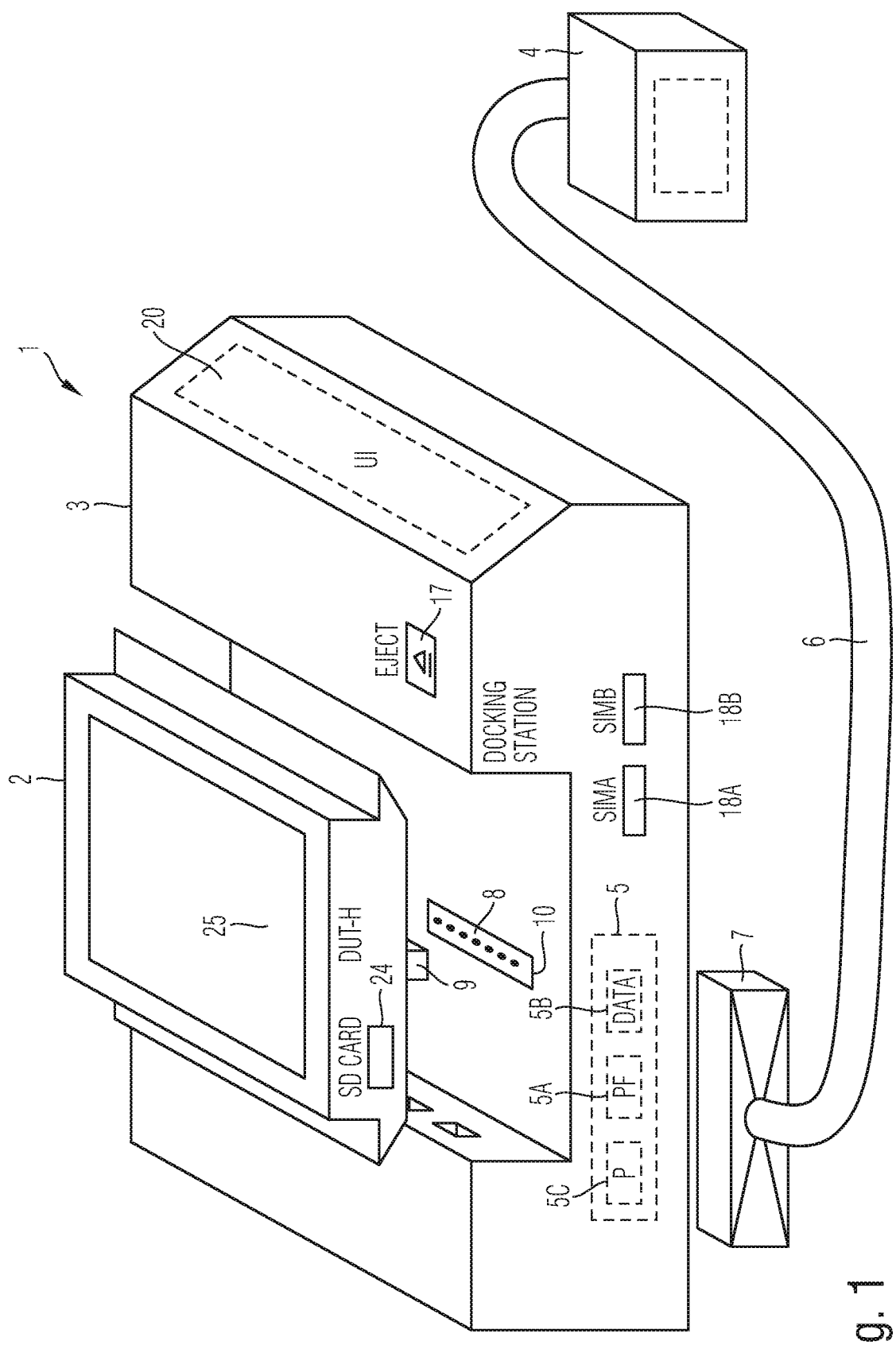
FIG. 1 shows a view on a possible exemplary embodiment of a test adapter apparatus according to the first aspect of the present invention.

As can be seen in the embodiment illustrated in FIG. 1, a test adapter apparatus 1 according to the first aspect of the present invention can comprise as main components at least one device under test holder 2 and a corresponding docking station 3. The device under test holder 2 is adapted to hold a device under test DUT which can be plugged into the docking station 3 of the test adapter apparatus 1. The device under test held by the device under test holder 2 can comprise a mobile radio device. The docking station 3 comprises RF and data interfaces which are used for connecting the device under test DUT held by the device under test holder 2 with at least one external test device 4 through said docking station 3 as illustrated in FIG. 1. The test device 4 can comprise a measurement equipment which is used to measure and to test a device under test DUT during a development stage and/or a production stage. In the illustrated embodiment of FIG. 1, the docking station 3 comprises at least one first docking station interface connector 5 for connection of the at least one external test device 4 with the docking station 3. In the illustrated exemplary embodiment of FIG. 1, the external test device 4 is connected through a cable 6 with a plug-in connector 7 which can be connected with the first docking station interface connector 5 of the docking station 3. The test adapter apparatus 1 further comprises at least one second docking station interface connector 8 for connection of the device under test holder 2 of the docking station 3. In the illustrated embodiment of FIG. 1, the device under test holder 2 comprises on its bottom side a connector 9 which can be plugged into the second docking station interface connector 8. The second docking station interface connector 8 can be provided at a device under test holder slot 10 into which the device under test holder interface connector 9 of the device under test holder 2 is pluggable to establish a connection between the second docking station interface connector 8 and the device under test holder interface connector 9 of the device under test holder 2.

The first docking station interface connector 5 of the docking station 3 can comprise in a possible embodiment a first RF interface 5A provided for RF signals and a first data interface 5B provided for data signals. In a possible embodiment, the first docking station interface connector 5 of the docking station 3 further comprises a first power supply interface 5C provided for a power supply of the docking station 3 and/or a device under test DUT held by the device under test holder 2 plugged into the docking station 3. In a possible embodiment, the power supply can be provided by a power supply source or power supply unit of the testing device 4 as shown in FIG. 1. In an alternative embodiment, the power supply can be provided by a separate power supply unit as illustrated in the embodiment shown in FIG. 4.

Figure 3:
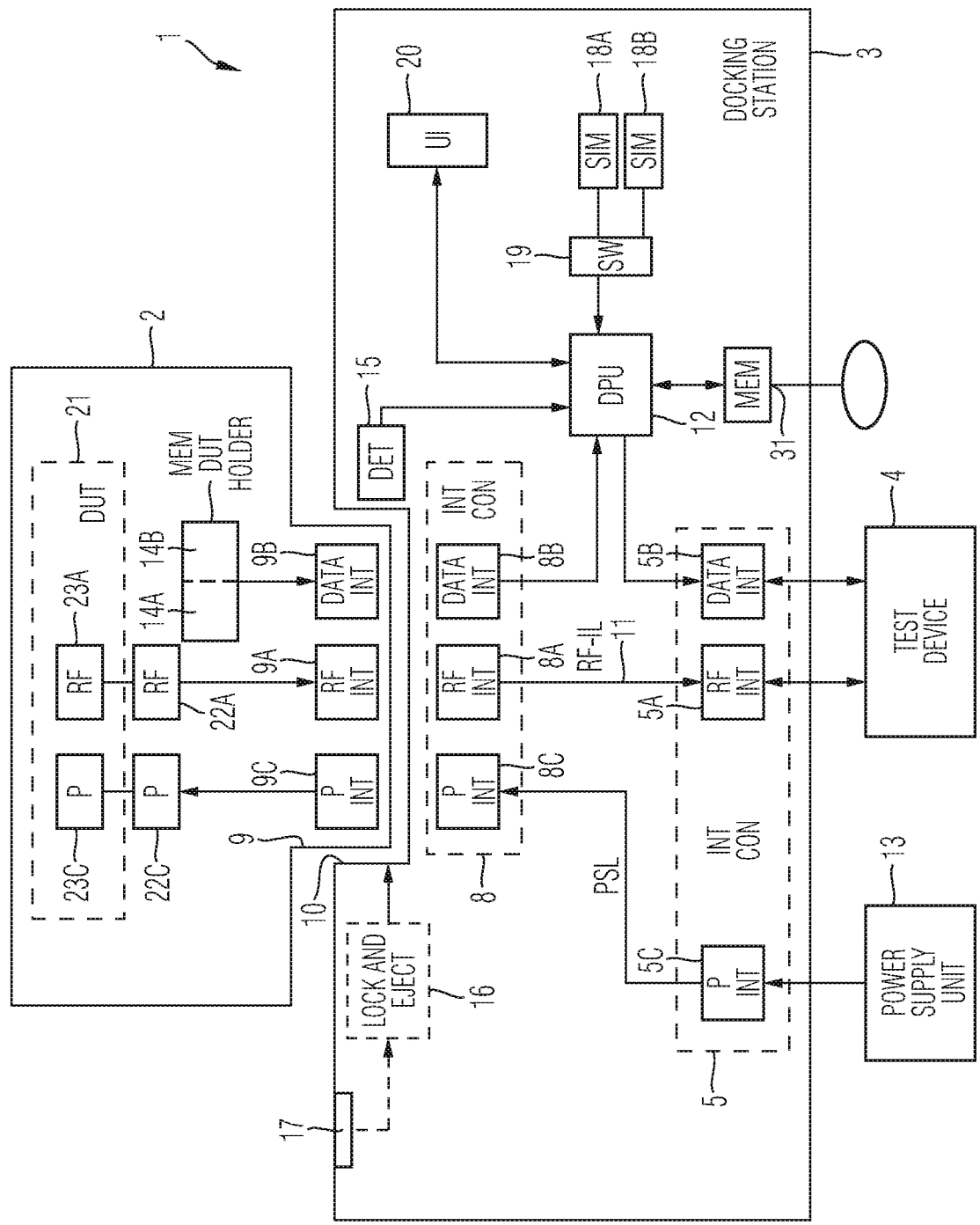
FIG. 3 shows a schematic block diagram for illustrating an exemplary embodiment of a test adapter apparatus according to the first aspect of the present invention.

The second docking station interface 8 of the docking station 3 can comprise in a possible embodiment a second RF interface 8A, a second data interface 8B for data signals and a second power supply interface 8C for a power supply as also illustrated in the block diagram of FIG. 3. As can be seen in the block diagram of FIG. 3, a first RF interface 5A of the first docking station interface connector 5 is directly connected via RF signal lines 11 arranged within the docking station 3 to the second RF interface 8A of the second docking station interface connector 8. The first data interface 5B of the first docking station interface connector 5 is connected in the illustrated embodiment to a data processing unit 12 of the docking station 3. The data processing unit 12 can comprise one or several processors or microprocessors for processing data. The second data interface 8B of the second docking station interface connector 8 of the docking station 3 is connected also to the data processing unit 12 of the docking station 3 as illustrated in FIG. 3.

The second docking station interface connector 8 of the docking station 3 is provided at a device under test DUT holder slot 10 of the docking station 3 into which the device under test holder 2 can be plugged in. As illustrated schematically in the diagram of FIG. 3, the device under test holder 2 comprises a housing having at least one device under test holder interface connector 9 which can be plugged into the corresponding second docking station interface connector 8 of the docking station 3. As illustrated in FIG. 3, the device under test holder interface connector 9 can comprise in the illustrated embodiment an RF interface 9A for RF signals, a data interface 9B for data signals and a power supply interface 9C for providing a power supply to circuits within the device under test holder 2 and/or to the device under test DUT placed into the device under test holder 2.

The first power supply interface 5C of the first docking station interface connector 5 can be connected to an external power supply source or power supply unit 13 as also illustrated in the schematic diagram of FIG. 3. The power supply unit 13 can also be integrated in the test device 4 as illustrated in the embodiment of FIG. 1. The second power supply interface 8C of the second docking station interface connector 8 is connectable to the power supply interface 9C of the device under test holder interface connector 9 of the device under test holder 2.

In a possible embodiment, the data interface 9B of the device under test holder interface connector 9 of the device under test holder 2 is connected to a first memory 14A of the device under test holder 2 storing device under test-specific data of the device under test DUT held by the device under test holder 2. The device under test-specific data can comprise for instance a DUT identifier such as a serial number of the device, a DUT type indicating the type of the device under test DUT held by the device under test holder, DUT configuration data and DUT calibration data. The device under test-specific data can further comprise DUT operating power requirements and/or used interface lines. The calibration data can for instance comprise attenuation values for RF cabling. Further device under test-specific data can comprise a DUT software version of software components implemented in the device under test DUT.

As illustrated in the block diagram of FIG. 3, the data interface 9B of the device under test holder interface connector 9 of the device under test holder 2 is connected to a second memory 14B of the device under test holder 2 storing DPU configuration data. The DPU configuration data stored in the second memory 14B can be used to configure the data processing unit 12 within the docking station 3 to control the device under test DUT held by the DUT holder 2 during a measurement and/or testing process. In a possible embodiment, the data processing unit 12 can comprise computing or calculation means which make the device-specific information data available to the external test device 4 connected to the docking station 3. The first memory 14A and the second memory 14B of the device under test holder 2 can form part of the same data storage. This data storage is in a preferred embodiment a non-volatile memory.

In the illustrated embodiment of FIG. 3, the docking station 3 comprises a plug-in detector 15 which is adapted to detect an insertion of the device under test holder 2 plugged into the device under test holder slot 10 of the docking station 3. The plug-in detector 15 is adapted to notify the data processing unit 12 of the docking station 3 about the plugged-in device under test holder 2 to access the first memory 14A integrated or inserted in the plugged-in device under test holder 2 for loading device under test-specific data of the device under test DUT held by the plugged-in device under test holder 2 and to access the second memory 14B integrated or inserted into the device under test holder 2 for loading DPU configuration data used by the data processing unit 12 of the docking station 3 to control the device under test DUT held by the plugged-in DUT holder 2 during a test and/or measurement procedure performed by the test or measurement equipment 4 of the test setup. The docking station 3 comprises a lock and eject mechanism 16 which is provided to lock the plugged-in device under test holder 2 after having been inserted into the slot 10 of the docking station 3. The lock and eject mechanism 16 can be connected to an eject button 17 which can be pressed by an operator to unlock the lock and eject mechanism 16 and to eject the device under test holder 2 from the docking station 3. In a possible embodiment, a lock and eject mechanism 16 is provided for each receiving slot 10 of the docking station 3.

In the illustrated embodiment of FIG. 3, the docking station 3 comprises at least one SIM card holder and/or SIM card simulator. In the illustrated embodiment of FIG. 3, the docking station 3 comprises two SIM card holders 18A, 18B. The SIM card holders 18A, 18B can receive SIM cards used for testing the device under test DUT held by the device under test holder 2. In the illustrated embodiment of FIG. 3, the docking station 3 comprises a controllable switch unit 19 which is provided to switch selectively a SIM card holder 18A, 18B to the data processing unit 12 of the docking station 3. The data processing unit 12 can read data from a SIM card inserted into a SIM card holder 18A, 18B and switched through the switching means 19 to the data processing unit 12. The switching unit 19 can be controlled by a processor of the data processing unit 12 and/or by a processor of the test device 4. In the illustrated embodiment of FIG. 3, the docking station 3 further comprises a user interface 20, in particular a graphical user interface, such as a touchscreen. The user interface 20 can comprise a display for displaying data or information to the user and input means such as a keyboard for receiving instructions from the user. In a possible embodiment, the mechanical eject button 17 can be replaced by a control line providing a control signal from the data processing unit 12 to the lock and eject mechanism 16 in response to an input received by the user through the user interface 20. In the illustrated embodiment of FIG. 3, the data processing unit 12 has also access to a local data memory 31 of the docking station 3.

The test adapter docking station 3 of the test setup as illustrated in FIG. 3 has at least one first docking station interface connector 5 having RF and data interfaces for connection to the test device 4. Further, the test adapter docking station 3 comprises at least one second docking station interface connector 8 also having RF and data interfaces for connection of the device under test holder 2 which holds the device under test DUT to be tested by the test device 4 through said test adapter docking station 3. In the illustrated embodiment of FIG. 3, the test adapter docking station 3 has a single first docking station interface connector 4 and a single second docking station interface connector 8. In alternative embodiments, the docking station 3 may comprise more than one first docking station interface connector 5 and more than one second docking station interface connector 8. Accordingly, the test adapter docking station 3 can also be connected to several test devices 4 via associated first docking station interface connectors 5 for performing different tasks during a measurement and/or testing procedure. Further, several device under test holders 2 can be plugged into a corresponding number of receiving slots 10 of the docking station 3. This allows to test several devices under test DUT held by the different device under test holders 2 at the same time by the test device 4. Further, the test device 4 can also test the interoperation between two different devices under test DUT plugged into the docking station 3. In the illustrated embodiment of FIG. 3, the device under test DUT such as a mobile radio communication device is inserted into a reception chamber 21 of the device under test holder 2. In the illustrated embodiment of FIG. 3, the device under test holder 2 comprises a data memory 14A, 14B storing the device under test-specific data of the inserted device under test DUT and further storing DPU configuration data for controlling the device under test DUT by the data processing unit 12 of the docking station 3. The device under test holder 2 comprises a device under test holder interface connector 9 adapted to be plugged into the device under test holder slot 10 of the docking station 3. The RF interface 9A of the device under test holder interface connector 9 is connected to internal RF interface ports 22A connectable to RF interface pins 23A of the device under test DUT inserted in the receiving chamber 21. The power supply interface 9C of the device under test holder interface connector 9 is connected to power supply interface pins 22C which are connectable to associated power supply pins 23C of the device under test DUT inserted into the receiving chamber 21 of the device under test holder 2.

In a possible embodiment, the memories 14A, 14B can be integrated in the device under test holder 2. In an alternative embodiment, the memories 14A, 14B can form part of an insertable data carrier such as an SD card inserted into an SD card slot 24 of the device under test holder 2 as illustrated for example in the embodiment of FIG. 1.

The device under test holder 2 can comprise a cover 25 for covering the device under test DUT held within the reception chamber 21 of the device under test holder 2. In a possible embodiment, the device under test holder 2 comprises an RF permeable cover. In an alternative embodiment, the device under test holder 2 can also comprise an RF shielding cover.

In a still further possible embodiment, the device under test holder 2 can comprise an optical transparent cover 25. In an alternative embodiment, the device under test holder 2 can comprise an optical opaque cover 25.

Figure 2:
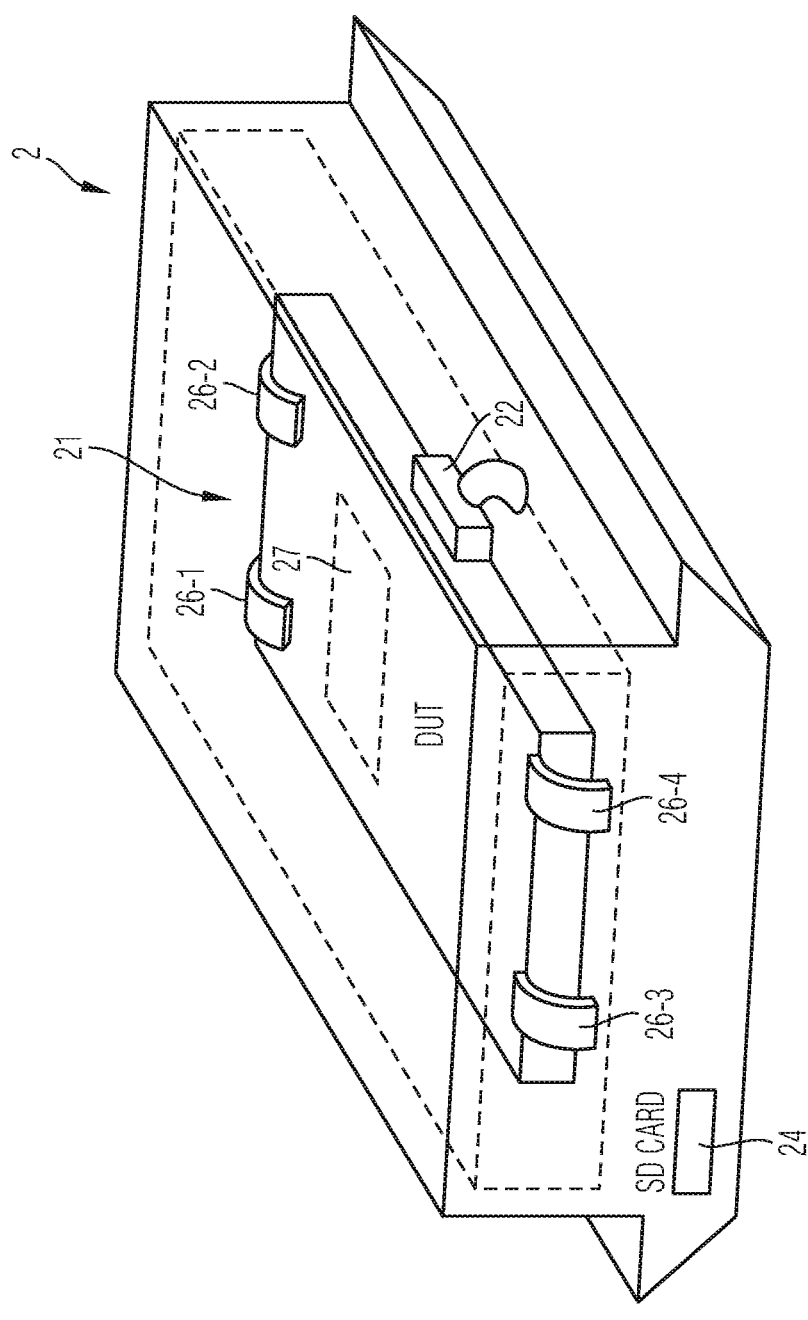
FIG. 2 shows a view of a possible exemplary embodiment of a device under test holder according to a further aspect of the present invention.

FIG. 2 illustrates a possible exemplary embodiment of a device under test holder 2 according to an aspect of the present invention. The device under test holder 2 has at least one reception chamber 21 adapted to receive and hold the device under test DUT. The device under test DUT can be for instance a mobile radio device clamped by clamping elements 26-1, 26-2, 26-3, 26-4 in the reception chamber 21 of the device under test holder 2. The device under test holder 2 comprises an integrated interface 22 for connection to power supply means 23C and RF pins 23A of the inserted device under test DUT.

In a possible embodiment, the device under test holder 2 comprises a reception chamber 21 without a cover 25. In an alternative embodiment, the device under test holder 2 comprises a cover 25 as also illustrated in the embodiment of FIG. 1. In a possible embodiment, the cover 25 is made of an optical transparent material allowing the user to look inside the reception chamber 21 and even to look at a display 27 of the device under test DUT during testing. In a possible exemplary embodiment, the video signal displayed by the display unit 27 of the device under test DUT visible through the transparent optical cover 25 can also be sensed by a sensing device connected to the test device 4 of the test setup. The received video signal supplied to the test device 4 can be evaluated during testing of the device under test DUT. In an alternative embodiment, the cover 25 of the device under test holder 2 is not transparent but optical opaque. In this embodiment, the device under test DUT enclosed by the device under test holder 2 is not visible to the user so that confidentiality requirements are fulfilled. In a possible embodiment, the device under test holder 2 further comprises locking means adapted to lock the cover 25 of the device under test holder 2. Accordingly, a device under test DUT inserted into the reception chamber 21 can be locked by the locking means of the device under test holder 2 and may be sent to an external laboratory for performing testing without exposing which device under test DUT is tested by the testing device 4. In this scenario, the testing organization may perform a blind test without knowing the type of the device under test DUT tested by the testing device 4.

In a possible embodiment of the device under test 102 as illustrated in FIG. 2, the device under test holder 2 comprises an RF permeable cover. In an alternative embodiment, the device under test holder 2 comprises an RF shielding cover 25. The RF shielding cover 25 can ensure that the device under test DUT is not affected by interference from other external test systems or signal sources which may distort measurement results. Further, the RF shielding cover 25 can prevent other external instruments or test devices from being affected by the testing of a radio interface of the device under test DUT.

In a possible embodiment, after initial mounting, the device under test DUT can remain in the device under test holder 2 for several test and measurement procedures. A confidential device under test DUT can be protected in a sealed enclosure or cover while the connectors of the device under test DUT remain accessible to the test device 4. The device identification as well as required configuration and calibration values can be stored in a local memory 14B of the device under test holder 2. In a possible embodiment, the DPU configuration data stored in the second memory of the device under test holder 2 can comprise a boot image and/or configuration files including an operating system, device drivers, control software components and/or automation software components used by the data processing unit 12 of the docking station 3 to control the device under test DUT held by the device under test holder 2. A complete disk image for a control computer can be stored in the device under test holder 2 ensuring that matching device drivers and control software for the device under test are available. The physical shape of the device under test holder 2 can allow easy storage and is suitable for a robotic handling of the device under test holder 2. In a possible embodiment, the device under test holder 2 as illustrated in FIG. 2 can be stacked with other device under test holders 2 into a device under test holder stack which may be handled by robotic means during test and/or production processes. In a possible embodiment, the device under test holder 2 comprises a casing of a housing protecting the inserted device under test DUT from the environment, in particular from damaging mechanical forces. In a possible embodiment, the casing of the device under test holder 2 can be coded, for instance color-coded, to indicate which kind of device under test DUT has been inserted into the reception chamber 21 of the device under test holder 2. For instance, the device under test holder 2 with a specific color (for instance a golden color) may contain a calibrated and fully functional device under test DUT which can be inserted into a slot of the docking station 3 to calibrate and verify the measurement and/or test setup itself. The measurement and test setup is equipped with the docking station 3 into which any device under test holder 2 can be inserted easily without the risk of making faulty connections. The resulting mechanical and electric configuration is thus fully reproducible. Device identification data and device-specific data can be read from the memory provided within the device under test holder 2 ensuring proper identification and configuration in an automated test setup. Likewise, the data processing unit 12 within the docking station 3 can be properly configured to control the device under test DUT using this image stored in the memory of the device under test holder 2.

In a possible embodiment, the test device 4 can comprise a network simulator. The docking station 3 can either be connected to a network simulator setup or it can be set up to hold the device under test DUT for a field test in a public network. The docking station 3 with multiple device holder slots 10 can be provided to connect multiple devices under test DUT in one test setup. An automated test setup can then switch between those devices for unattended operation.

In an alternative embodiment, the docking station 3 can also be integrated into the measurement equipment or test device 4 itself as also illustrated in the embodiment of FIG.

5. This reduces cabling efforts and RF attenuation. The device under test holder 2 for the device under test DUT such as a mobile radio device can be plugged into the matching docking station 3. The device under test holder 2 can be easily inserted into the slot 10 of the docking station 3 and is then held in place until it is released by pressing for instance an eject button 17. All required electrical connections, in particular RF lines, supply voltage lines, control interface lines, are provided by suitable connectors when the device under test holder 2 is placed into the docking station 3.

The device under test DUT can comprise different kinds of devices under test DUT, for instance a mobile radio device. The device under test DUT can be for instance a prototype board or a device with specific modifications such as additional RF connections. Further, the device under test DUT can also comprise an unmodified product which is firmly mounted onto the device under test holder 2. The electrical connections can be made to ports provided on the device under test holder 2. The device under test holder 2 is either open or enclosed with a cover. The cover can be made of a transparent material or enclosed with an RF shielding material. A strong enclosure which can be sealed and locked can be provided as an option to protect sensitive devices under test DUT such as early prototypes of mobile phones.

The device under test holder 2 contains a non-volatile storage 14A, 14B which can be accessed from the docking station 3. The memory can store device-specific information, e.g. type and serial number, calibration data, operating power requirements, used interface lines and/or software versions of software components implemented in the device under test DUT. The device under test holder 2 can further comprise a tag such as an integrated RFID tag.

The memory of the device under test holder 2 can comprise data adapted to configure a computer or processing unit in the docking station 3 (e.g. as a boot image) to control the device under test. This provides an operation system, device drivers, control software and/or automation software, etc. as required to operate the device under test DUT. Interface lines are available at the device under test holder 2 for connection of the device under test DUT and are routed to the docking station 3 via the docking connector. Interface lines can include RF lines such as mobile radio, GNS, WLAN, Bluetooth, etc. The lines further comprise power supply lines, current sensing lines, battery lines, USB lines, SIM lines, audio lines and other general purpose lines.

The docking station 3 provides a slot 10 for the device under test holder 2 with a lock and eject mechanism 16 and matching electrical connectors. Interface lines like the RF lines are routed to external connectors 5 for the connection of the measuring equipment 4. The docking station 3 can further provide holders and/or simulators for SIM cards.

The docking station 3 can contain a detection unit adapted to detect the insertion of a device under test holder 2 initiating access to the data memory of the inserted device under test holder 2. The data processing unit 12 is adapted to read out the device-specific data and can make it available to the measurement equipment 4 over the suitable interface 5B.

The docking station 3 may contain a power supply unit which can be used to power the device under test DUT held in the device under test holder 2. In a possible embodiment, a supply voltage and overcurrent protection can be configured according to configuration data read from the memory of the device under test holder 2. The power supply can be switched by the measuring equipment 4 in a possible embodiment.

Figure 4:
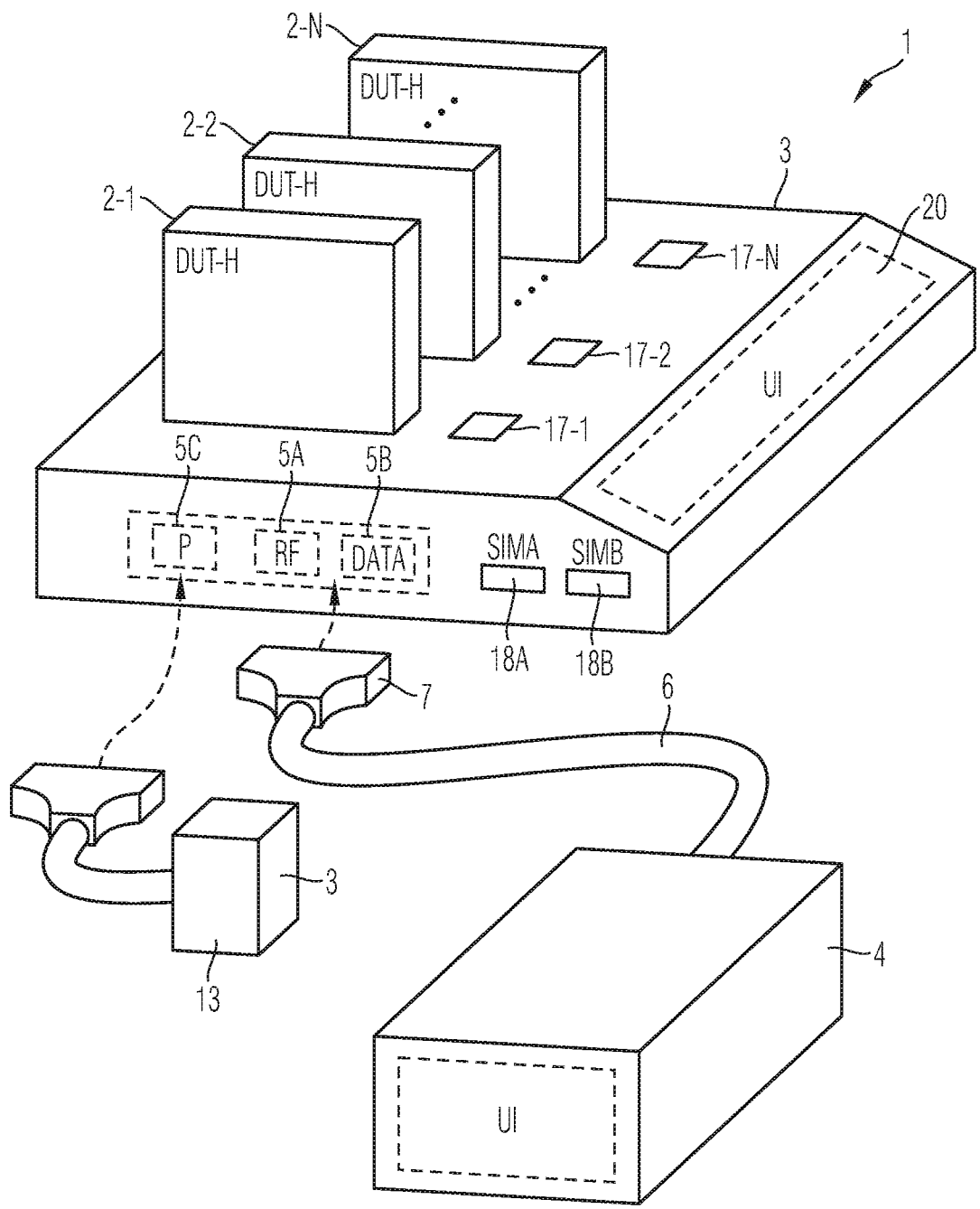
FIG. 4 shows a view on a further possible exemplary embodiment of a test adapter apparatus according to the first aspect of the present invention.

FIG. 4 shows a further possible exemplary embodiment of a test adapter apparatus according to the first aspect of the present invention. In the illustrated embodiment of FIG. 4, a separate power supply unit 13 can be connected to the power supply interface 5C of the docking station 3. Further, in the illustrated embodiment of FIG. 4, a predetermined number N of device under test holders 2 can be inserted into the docking station 3. In the illustrated embodiment, the docking station 3 comprises N receiving slots 10 for receiving several device under test holders 2 holding the same or different devices under test DUT. In a possible embodiment, the devices under test DUT held by the different device under test holders 2-*i* can be tested simultaneously by the testing device 4. For instance, the same kind of devices under test DUT can be tested in parallel by the testing device 4. In a possible embodiment, the testing device 4 can receive and/or supply RF signals to the different devices under test DUT held within the device under test holders 2-*i* in a testing procedure. Also, the associated data of the different devices under test DUT are accessible by the data processing unit 12 of the docking station 3 and can also be supplied to the test device 4 via the data interface 5B. SIM cards can be inserted into the SIM card holders 18A, 18B. The number of SIM card holders and/or SIM card simulators can vary depending on the use case. SIM cards inserted into the SIM card holders can be switched to access data associated with different devices under test DUT held by different device under test holders 2-*i*. In a possible embodiment, the external testing device 4 can comprise a user interface including a display and input means to input data. In a still further possible embodiment, the testing device 4 can be controlled by a user by means of the user interface 20 of the docking station 3 as shown in FIG. 4. The user interface 20 can also control the locking and ejecting mechanism 16 electronically without the provision of the eject buttons 17-*i* shown in FIG. 4. In the illustrated embodiment of FIG. 4, the device under test holders 2 are inserted into the receiving slots 10 of the docking station 3. In this embodiment, the connector 9 of the device under test holder 2 can be provided at the bottom side of the housing of the device under test holder 2. In the embodiment illustrated in FIG. 4, the devices under test DUT within the device under test holders 2-*i* are positioned in a vertical position during testing. In contrast, in the embodiment illustrated in FIG. 1, the device under test DUT held within the receiving chamber 21 of the device under test holder 2 is held in a horizontal position during testing.

Figure 5:
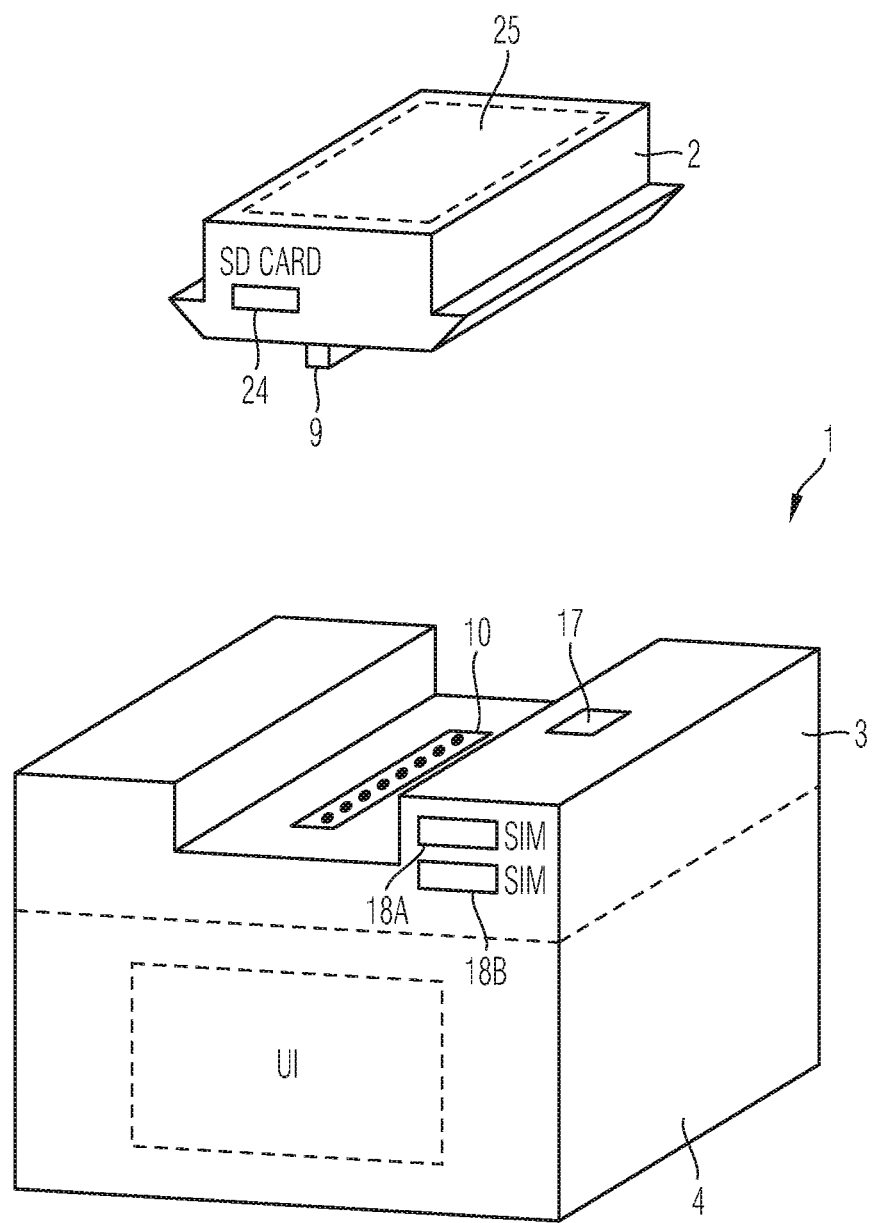
FIG. 5 shows a view on a further possible exemplary embodiment of a test adapter apparatus according to the first aspect of the present invention.

FIG. 5 shows a further exemplary embodiment of a test adapter apparatus 1 according to the first aspect of the present invention. In the illustrated embodiment, the docking station 3 is integrated in the housing of the testing device 4. In the illustrated embodiment, the docking station 3 is provided on top of the housing of the testing device 4. The illustrated embodiment of FIG. 5 has the advantage that connectors and cables between the testing device 4 and a circuitry within the docking station 3 can be avoided. Further, the docking station 3 and the testing device 4 can comprise a common user interface UI.

Figure 6:
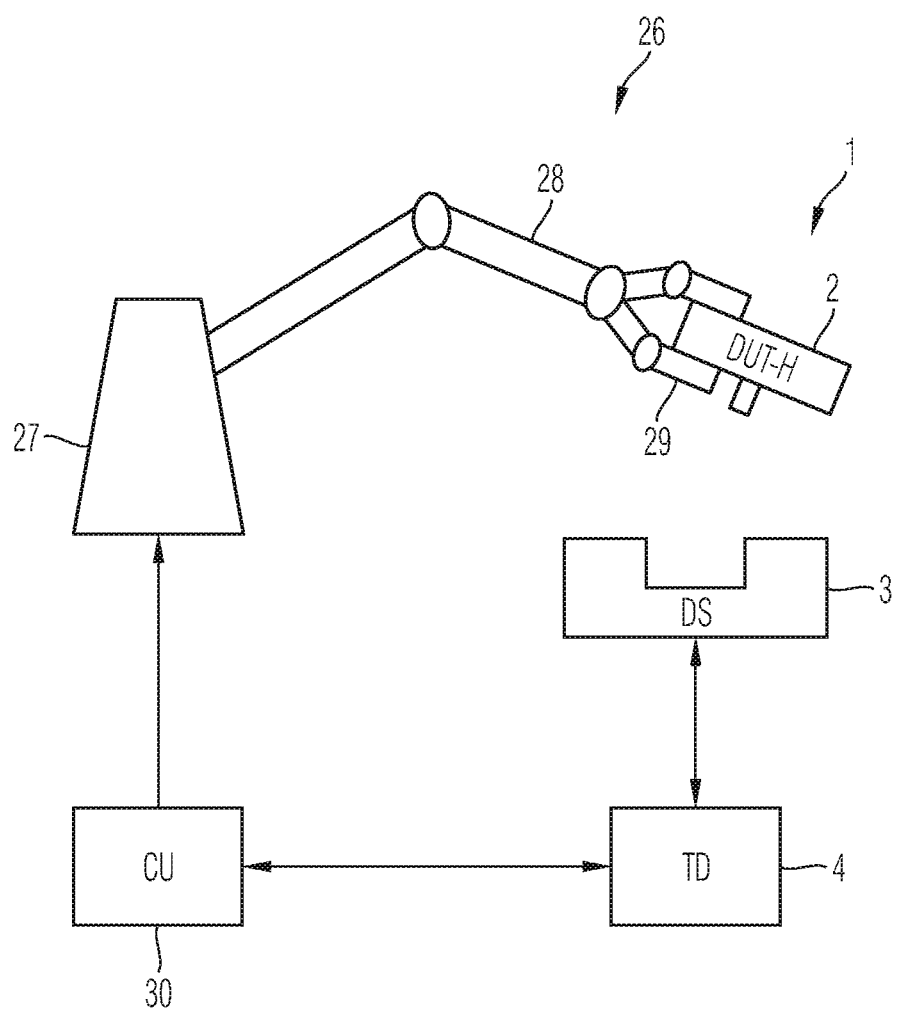
FIG. 6 shows a schematic diagram illustrating a possible use case of a test adapter apparatus in an automation system.

FIG. 6 shows a schematic diagram for illustrating an automation system 26 comprising an test adapter apparatus 1 according to the first aspect of the present invention. In the illustrated exemplary embodiment of the automation system 26, a robot unit 27 comprising a robot arm 28 with a grabbing mechanism 29 can be used to grab and hold the device under test holder 2 with the inserted device under test DUT. The robot unit 27 can be controlled by a control unit 30 which may be connected via a data and control interface with the testing device 4 as shown in FIG. 6. The device under test holder 2 with the inserted device under test DUT can be placed automatically under the control of the control unit 30 into the docking station 3 of the test adapter apparatus 1. After the device under test holder 2 has been plugged into an associated slot 10 of the docking station 3, this can be detected by the plug and detection unit 15 notifying the test device 4 and/or notifying the control unit 30 of the automation cell. In a possible embodiment, the device under test holder 2 can also comprise a tracking mechanism which allows to track the device under test holder 2 within the automation system 26 or production facility. In a possible embodiment, the tracking mechanism allows to track the current position of the device under test holder 2 relative to the docking station 3 of the test adapter apparatus 1. After the device under test holder 2 has been plugged into the corresponding slot 10 of the docking station 3, the testing device 4 can initiate a testing procedure by exchanging RF signals with the device under test DUT held by the device under test holder 2 and by evaluating data received from the docking station 3. After the testing process has been accomplished, the testing device 4 can notify the control unit 30 of the automation cell to remove the device under test holder 2 from the docking station 3.

Figure 7:
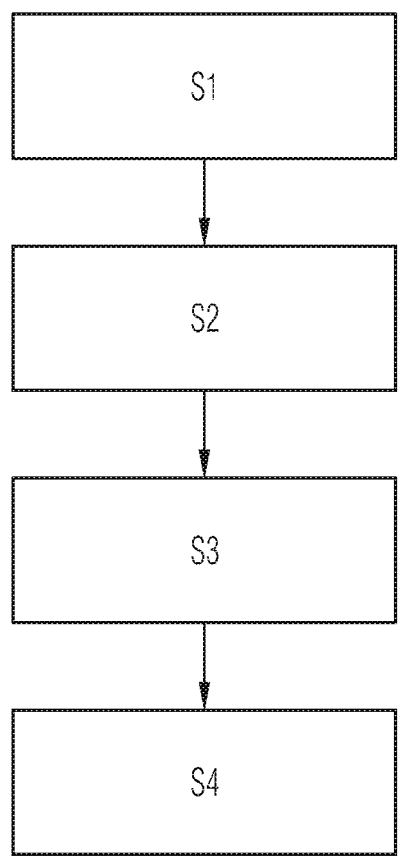
FIG. 7 shows a flowchart of a possible exemplary embodiment of a method for testing a device under test according to a further aspect of the present invention.

FIG. 7 shows a flowchart of a possible exemplary embodiment of a method for testing a device under test DUT according to a further aspect of the present invention.

In a first step S1, the device under test DUT is inserted into a device under test holder 2. In a further step S2, the device under test holder 2 is plugged into a device under test holder slot 10 of a docking station 3. The plugged-in device under test holder 2 comprises the inserted device under test DUT. The docking station 3 may detect that a device under test holder 2 has been plugged into a slot 10 of the docking station 3. In a further step S3, a connection between the docking station 3 and the external test device 4 can be automatically established. For instance, the test device 4 can be informed by the docking station 3 that a specific device under test DUT has been plugged into a specific slot 10 of the docking station 3 and is ready for testing.

In a further step S4, the external test device 4 can perform testing of the device under test DUT through the docking station 3 by processing RF signals and/or data of the device under test DUT inserted in the plugged-in device under test holder 2.

The testing illustrated in FIG. 7 can be performed during a development stage and/or during a manufacturing stage of the device under test DUT. For instance, a successfully tested device under test DUT might be removed from the device under test holder 2 for assembly in a user equipment device. The testing procedure can be protocolled using protocol files stored in the local memory 31 of the docking station 3.

The different embodiment described above can be combined with each other.

Further embodiments are possible. For instance the docking mechanism of the cover 25 of the DUT holder 2 can be controlled such that it is only unlocked when the user has been authorized to do so, e.g. when a matching password has been input into the user interface 20 or by means of a fingerprint scanner integrated in the docking station or in the DUT holder 2.

Further the data interface 5B of the docking station 3 can be implemented as a wired or wireless interface.

The docking station 3 can be a portable mobile device which can be used for in-field tests of DUTs. The docking station 3 can also be used for test preformed in a laboratory or in a production facility. For in-field tests the DUT holders 2 can be sealed against humidity. Further the housing of the DUT holder 2 is robust and offers protection against environmental influences affecting the test results.

What is claimed is:

1. A test adapter apparatus comprising:
at least one device under test, DUT, holder adapted to hold a device under test, DUT, and adapted to be plugged in into a docking station of said test adapter apparatus,
wherein the docking station has RF and data interfaces used for connecting at least one external test device through said docking station with the device under test, DUT, held by said device under test holder, wherein the docking station comprises:
at least one first docking station interface connector for connection of the at least one external test device with said docking station and
at least one second docking station interface connector for connection of said device under test holder with said docking station,
wherein the first docking station interface connector of the docking station comprises:
a first RF interface provided for RF signals,
a first data interface provided for data signals,
a first power supply interface provided for a power supply, and
wherein the second docking station interface connector of the docking station comprises:
a second RF interface provided for RF signals,
a second data interface provided for data signals, and
a second power supply interface provided for a power supply.

2. The test adapter apparatus according to claim 1, wherein the first RF interface of the first docking station interface connector is directly connected via RF signal lines within said docking station to the second RF interface of the second docking station interface connector,
wherein the first data interface of the first docking station interface connector is connected to a data processing unit, DPU, of the docking station and
wherein the second data interface of the second docking station interface connector is connected to said data processing unit, DPU, of said docking station.

3. The test adapter apparatus according to claim 1, wherein the second docking station interface connector of the docking station is provided at a device under test, DUT, holder slot of the docking station into which a DUT holder is pluggable to establish a connection between the second docking station interface connector and a device under test, DUT, holder interface connector of said device under test, DUT, holder.

4. The test adapter apparatus according to claim 3, wherein the DUT holder interface connector comprises:
an RF interface provided for RF signals,
a data interface provided for data signals, and
a power supply interface provided for power supply.

5. The test adapter apparatus according to claim 1, wherein the first power supply interface of the first docking station interface connector is connected to a power supply source and
wherein the second power supply interface of the second docking station interface connector is connectable to the power supply interface of the device under test, DUT, holder interface connector of the device under test, DUT, holder.

6. The test adapter apparatus according to claim 4,
wherein the RF interface of the DUT holder interface connector of the DUT holder is connected to RF interface ports of the device under test, DUT, held by the DUT holder and
wherein the power supply interface of the DUT holder interface connector of the device under test, DUT, holder is connected to power supply pins of the device under test, DUT, held by the DUT holder.

7. The test adapter apparatus according to claim 4,
wherein the data interface of the DUT holder interface connector of the DUT holder is connected to a first memory of the DUT holder storing DUT specific data of the device under test, DUT, held by the DUT holder comprising a DUT-identifier, a DUT type, DUT configuration data, DUT calibration data, DUT operating power requirements, and used interface lines.

8. The test adapter apparatus according to claim 4, wherein the data interface of the DUT holder interface connector of the DUT holder is connected to a second memory of the DUT holder storing DPU configuration data used to configure a data processing unit, DPU, of the docking station to control the device under test, DUT, held by the DUT holder.

9. The test adapter apparatus according to claim 8, wherein the DPU configuration data stored in the second memory of the DUT holder comprises a boot image and/or configuration files including an operating system, device drivers, control software components and/or automation software components used by the data processing unit, DPU, of the docking station to control the device under test, DUT, held by the DUT holder.

10. The test adapter apparatus according to claim 1, wherein the docking station comprises a plug-in detector adapt to detect an insertion of a DUT holder plugged into a DUT holder slot of said docking station.

11. The test adapter apparatus according to claim 10, wherein the plug-in detector of the docking station is adapted to notify the data processing unit, DPU, of the docking station about a plugged in DUT holder to access a first memory integrated in the plugged in DUT holder for loading DUT specific data of the device under test, DUT, held by the plugged in DUT holder and to access a second memory integrated into the DUT holder for loading DPU configuration data used by the data processing unit, DPU, of the docking station to control the device under test, DUT, held by the plugged in DUT holder.

12. The test adapter apparatus according to claim 1, wherein the docking station comprises at least one SIM card holder and/or SIM card simulator.

13. The test adapter apparatus according to claim 12, wherein the docking station comprises a controllable switch unit adapted to selectively connect a device under test, DUT, held by a DUT holder plugged into a DUT holder slot of the docking station to a SIM card holder and/or SIM card simulator of said docking station.

14. A test adapter docking station comprising:
at least one first docking station interface connector having a first RF interface provided for RF signals, a first data interface provided for data signals for connection to a test device and a first power supply interface provided for a power supply, and
at least one second docking station interface connector having a second RF interface and a second data interface provided for data signals for connection of a device under test, DUT, holder which holds a device under test, DUT, to be tested by the test device through said test adapter docking station, and a second power supply interface provided for a power supply.

15. A method for testing a device under test, DUT, comprising the steps of:
inserting the device under test, DUT, into a DUT holder,
plugging the DUT holder with the inserted device under test, DUT, into a DUT holder slot of a docking station, and
connecting the docking station with an external test device which performs testing of the device under test, DUT, through the docking station by processing RF signals and or data of the device under test, DUT, inserted in the plugged in DUT holder
wherein the docking station comprises:
at least one first docking station interface connector for connection of the external test device with said docking station and
at least one second docking station interface connector for connection of said DUT holder with said docking station,
wherein the first docking station interface connector of the docking station comprises:
a first RF interface provided for RF signals,
a first data interface provided for data signals,
a first power supply interface provided for power supply, and
wherein the second docking station interface connector of the docking station comprises:
a second RF interface provided for RF signals,
a second data interface provided for data signals, and
a second power supply interface provided for power supply.

* * * * *